(12) United States Patent
Matsukawa et al.

(10) Patent No.: US 11,467,219 B2
(45) Date of Patent: Oct. 11, 2022

(54) BATTERY MONITORING DEVICE, INTEGRATED CIRCUIT, AND BATTERY MONITORING SYSTEM

(71) Applicant: NUVOTON TECHNOLOGY CORPORATION JAPAN, Kyoto (JP)

(72) Inventors: Kazuo Matsukawa, Osaka (JP); Yu Okada, Osaka (JP); Yoshikazu Makabe, Osaka (JP); Hitoshi Kobayashi, Osaka (JP); Takeshi Misaku, Osaka (JP); Keiichi Fujii, Shiga (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 16 days.

(21) Appl. No.: 17/132,192

(22) Filed: Dec. 23, 2020

(65) Prior Publication Data
US 2021/0109160 A1    Apr. 15, 2021

Related U.S. Application Data

(63) Continuation of application No. PCT/JP2019/020801, filed on May 27, 2019.

(30) Foreign Application Priority Data

Jun. 27, 2018    (JP) .............................. JP2018-122507

(51) Int. Cl.
*G01R 31/389* (2019.01)
*G01R 31/392* (2019.01)
(Continued)

(52) U.S. Cl.
CPC ....... *G01R 31/389* (2019.01); *G01R 31/3842* (2019.01); *G01R 31/392* (2019.01); *H02J 7/0047* (2013.01)

(58) Field of Classification Search
None
See application file for complete search history.

(56) References Cited

U.S. PATENT DOCUMENTS

| | | | |
|---|---|---|---|
| 6,225,787 B1 * | 5/2001 | Chen | H02J 7/007194 320/150 |
| 2008/0284375 A1 * | 11/2008 | Nagaoka | B60L 50/64 320/116 |

(Continued)

FOREIGN PATENT DOCUMENTS

JP    5403437 B2    1/2014

OTHER PUBLICATIONS

International Search Report and Written Opinion dated Jul. 2, 2019 in International Application No. PCT/JP2019/020801; with partial English translation.

(Continued)

*Primary Examiner* — Jas A Sanghera
(74) *Attorney, Agent, or Firm* — McDermott Will & Emery LLP (57) ABSTRACT

A battery monitoring device includes a first reference resistor disposed in a path different from a path of current flowing from a battery to a load; a transistor for passing current from the battery to the first reference resistor; and an integrated circuit. The integrated circuit includes: a current measurement unit that measures a first current flowing through the first reference resistor; a voltage measurement unit that measures a first voltage of the battery; and a first calculation unit that calculates an AC impedance of the battery based on the first current measured and the first voltage measured.

19 Claims, 10 Drawing Sheets

(51) Int. Cl.
    *G01R 31/3842*    (2019.01)
    *H02J 7/00*    (2006.01)

(56) References Cited

U.S. PATENT DOCUMENTS

| | | | |
|---|---|---|---|
| 2009/0027056 A1* | 1/2009 | Huang | G01R 31/392 |
| | | | 320/132 |
| 2011/0001501 A1* | 1/2011 | Walker | G01R 35/00 |
| | | | 324/706 |
| 2011/0077879 A1* | 3/2011 | Paryani | G01R 31/389 |
| | | | 320/162 |
| 2012/0170157 A1 | 7/2012 | Holsen et al. | |
| 2013/0030596 A1 | 1/2013 | Okada et al. | |
| 2013/0093384 A1* | 4/2013 | Nyu | G01R 31/382 |
| | | | 320/107 |
| 2014/0285156 A1* | 9/2014 | Mukaitani | G01R 31/392 |
| | | | 320/134 |
| 2016/0169975 A1* | 6/2016 | Lin | G01R 31/389 |
| | | | 702/63 |
| 2018/0056809 A1* | 3/2018 | Uchida | H01M 10/441 |

OTHER PUBLICATIONS

Extended European Search Report dated Jul. 27, 2021, issued in corresponding European Patent Application No. 19825662.0.

* cited by examiner

BATTERY MONITORING DEVICE, INTEGRATED CIRCUIT, AND BATTERY MONITORING SYSTEM

CROSS REFERENCE TO RELATED APPLICATIONS

This application is a U.S. continuation application of PCT International Patent Application Number PCT/JP2019/020801 filed on May 27, 2019, claiming the benefit of priority of Japanese Patent Application Number 2018-122507 filed on Jun. 27, 2018, the entire contents of which are hereby incorporated by reference.

BACKGROUND

1. Technical Field

The present disclosure relates to a battery monitoring device that monitors the state of a battery.

2. Description of the Related Art

Automobiles that run by using a secondary battery as a power supply, such as hybrid electric vehicles (HEVs) or electric vehicles (EVs), have been developed. Techniques are also known in which a battery management system (BMS) is used to estimate the amount of remaining battery power and to detect abnormalities for the safe use of the secondary battery. As such a BMS, Japanese Patent No. 5403437 discloses a battery monitoring device that can monitor the battery state in real time.

SUMMARY

The present disclosure provides a battery monitoring device, an integrated circuit, and a battery monitoring system capable of measuring the AC impedance of a battery irrespective of whether or not the battery is being charged or discharged.

A battery monitoring device according to one aspect of the present disclosure includes: a resistor disposed in a path different from a path of current flowing from a battery to a load; a transistor for passing current from the battery to the resistor; and an integrated circuit, wherein the integrated circuit includes: a current measurement unit that measures a first current flowing through the resistor; a voltage measurement unit that measures a first voltage of the battery; and a first calculation unit that calculates an AC impedance of the battery based on the first current measured and the first voltage measured.

An integrated circuit according to one aspect of the present disclosure includes: a signal application unit that applies a control signal to a control terminal of a transistor for passing a current from a battery to a resistor disposed in a path different from a path of current flowing from the battery to a load; a current measurement unit that measures a first current flowing through the resistor; a voltage measurement unit that measures a first voltage of the battery; and a first calculation unit that calculates an AC impedance of the battery based on the first current measured and the first voltage measured.

A battery monitoring system according to one aspect of the present disclosure includes: a plurality of battery monitoring devices each of which is the above-described battery monitoring device; and an integrated control unit that obtains the AC impedance from each of the plurality of battery monitoring devices.

A battery monitoring system according to one aspect of the present disclosure includes: the above-described battery monitoring device; and a server device disposed at a location away from the battery monitoring device, wherein the server device obtains the AC impedance from the battery monitoring device.

An aspect of the present disclosure realizes a battery monitoring device, an integrated circuit, and a battery monitoring system capable of measuring the AC impedance of a battery irrespective of whether or not the battery is being charged or discharged.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, embodiments will be described with reference to the Drawings. It should be noted that each of the subsequently-described embodiments shows a generic or specific example of the present disclosure. The numerical values, shapes, materials, structural components, the arrangement and connection of the structural components, steps, the processing order of the steps, etc. shown in the following embodiments are mere examples, and thus are not intended to limit the present disclosure. Furthermore, among the structural components described in the following embodiments, structural components not recited in any one of the independent claims are described as optional structural components.

It should be noted that the respective figures are schematic diagrams, and thus are not necessarily accurate illustrations.

Embodiment 1

[Configuration]

Figure 1:
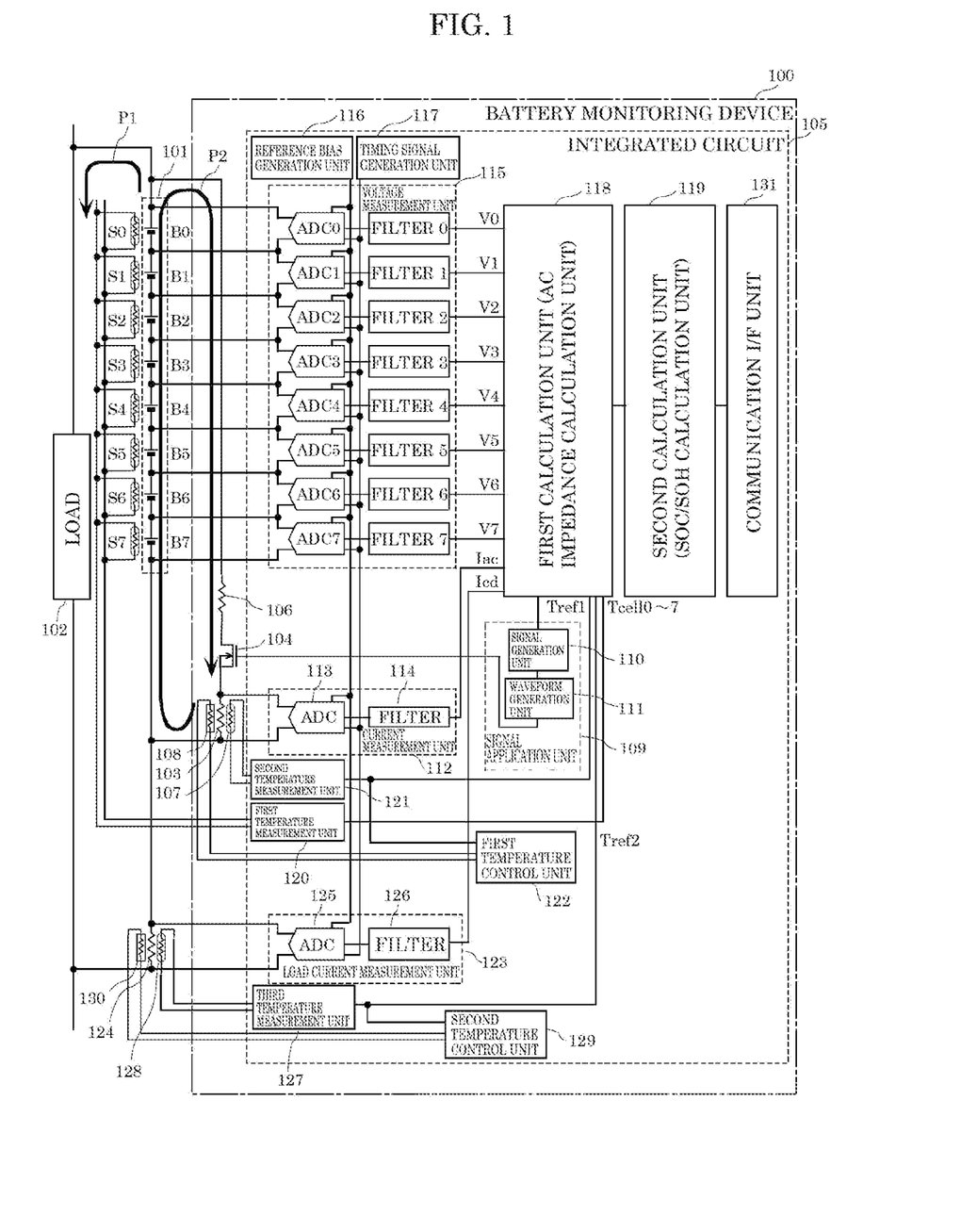
FIG. 1 is a block diagram of a functional configuration of a battery monitoring device according to Embodiment 1.

First, the configuration of a battery monitoring device according to Embodiment 1 will be described. FIG. 1 is a block diagram of a functional configuration of the battery monitoring device according to Embodiment 1.

Battery monitoring device 100 illustrated in FIG. 1 monitors the state of battery pack 101. Battery pack 101 includes batteries B0 to B7 (hereafter, any one of batteries B0 to B7 will be referred to as battery B). Batteries B are, in other words, battery cells. Batteries B are specifically lithium-ion batteries, but may be other types of batteries such as nickel-metal hydride batteries. Battery pack 101 functions as a power supply for load 102, and supplies power to load 102. Exemplary load 102 is, although not limited to, a motor of an EV. Instead of load 102, a charging device for charging battery pack 101 may be connected at the position of load 102.

Figure 2:
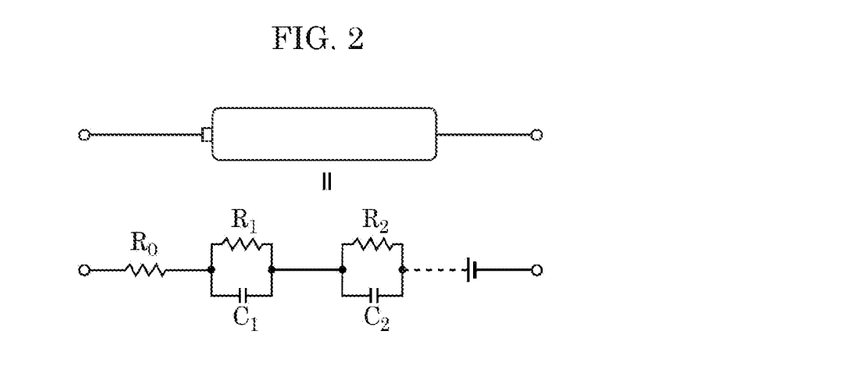
FIG. 2 is a diagram illustrating an equivalent circuit of a battery.

Specifically, battery monitoring device 100 can calculate and monitor the AC impedance of battery B. FIG. 2 is a diagram illustrating an equivalent circuit of battery B.

Figure 3:
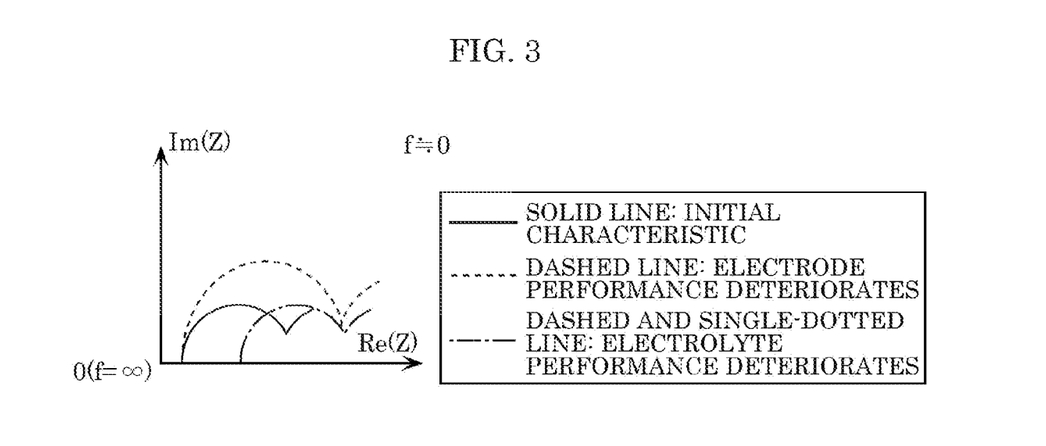
FIG. 3 is illustrates a relationship between changes in AC impedance of the battery and deterioration of the battery.

As illustrated in FIG. 2, battery B can be regarded as circuitry in which resistor R0, resistor R1, and capacitive element C1 connected in parallel, resistor R2 and capacitive element C2 connected in parallel, and so on, are serially connected. A circuit parameter in this circuitry (the resistance of the resistors, or the capacitance of the capacitive elements) changes as battery B deteriorates. That is, the AC impedance of battery B changes as battery B deteriorates. FIG. 3 illustrates the relationship between changes in the AC impedance of battery B and the deterioration of battery B. FIG. 3 is a diagram called a Cole-Cole plot, which is also called a Nyquist plot.

The AC impedance of battery B has an initial characteristic indicated by a solid line in FIG. 3. If the electrode performance of battery B deteriorates, the characteristic of the AC impedance of battery B changes into a characteristic indicated by a dashed line in FIG. 3. If the electrolyte performance of battery B deteriorates, the characteristic of the AC impedance of battery B changes into a characteristic indicated by a dashed and single-dotted line in FIG. 3.

As above, the degree of deterioration of battery B is related to the AC impedance of battery B. Battery monitoring device 100 can therefore determine the degree of deterioration of battery B by calculating and monitoring the AC impedance of battery B. Once the degree of deterioration is determined, information processing can be performed such as presenting a message that prompts to replace deteriorated battery B. The degree of deterioration of battery B is represented as, for example, a parameter called state of health (SOH).

As illustrated in foregoing FIG. 1, in battery monitoring device 100, the AC impedance is measured using first reference resistor 103 disposed in path P2 (in other words, a second path) different from path P1 (in other words, a first path) of current flowing from battery pack 101 to load 102. This enables battery monitoring device 100 to calculate the AC impedance of battery B irrespective of whether or not battery B is being charged or discharged. For example, battery monitoring device 100 can calculate the present AC impedance of battery B while battery B is being charged. Battery monitoring device 100 can also calculate the present AC impedance of battery B while battery B is being discharged. Battery monitoring device 100 can calculate the present AC impedance of battery B while the battery is not being charged or discharged.

A detailed configuration of battery monitoring device 100 as above will be described below with reference to foregoing FIG. 1. Battery monitoring device 100 includes first reference resistor 103, transistor 104, integrated circuit (battery monitoring circuit) 105, load resistor 106, temperature sensor 107, and heater 108.

First reference resistor 103 is disposed in path P2 different from path P1 of the current flowing from battery pack 101 to load 102. That is, first reference resistor 103 does not receive the current flowing through load 102. First reference resistor 103 is, for example, a discrete part provided externally to integrated circuit 105.

Transistor 104 is used to pass current from battery pack 101 to first reference resistor 103. Transistor 104 is a field effect transistor (FET), for example, but may be a bipolar transistor. Transistor 104 has its drain connected to load resistor 106, its source connected to first reference resistor 103, and its gate (that is, a control terminal) connected to signal application unit 109.

Integrated circuit 105 includes signal application unit 109, current measurement unit 112, voltage measurement unit 115, reference bias generation unit 116, timing signal generation unit 117, first calculation unit 118, second calculation unit 119, first temperature measurement unit 120, second temperature measurement unit 121, first temperature control unit 122, load current measurement unit 123, third temperature measurement unit 127, second temperature control unit 129, and communication interface unit 131.

Signal application unit 109 applies a control signal to the control terminal of transistor 104. Signal application unit 109 includes signal generation unit 110 and waveform generation unit 111.

Current measurement unit 112 measures the current Iac (an example of a first current) flowing through first reference resistor 103. Specifically, current measurement unit 112 measures the voltage at both ends of first reference resistor 103. Based on the resistance of first reference resistor 103, first calculation unit 118 can recognize the voltage at both ends of first reference resistor 103 as the current Iac.

Specifically, current measurement unit 112 includes: analog-to-digital (AD) converter 113 (shown as ADC) that converts the voltage at both ends of first reference resistor 103 (that is, an analog signal) into a digital signal; and filter 114 connected to an output of AD converter 113. AD converter 113 is a delta-sigma AD converter, for example, and filter 114 is a decimation filter. AD converter 113 is implemented by, for example, an AD converter having the same AD conversion characteristics as AD converters 0 to 7 (that is, an identical product). This can reduce measurement errors occurring between AD converters 0 to 7 and AD converter 113 due to AD conversion.

Voltage measurement unit 115 measures the voltages V0 to V7 (examples of a first voltage) of batteries B0 to B7 in battery pack 101. Voltage measurement unit 115 includes: AD converters 0 to 7 that convert the voltages V0 to V7 of batteries B0 to B7 into digital signals; and filters 0 to 7 connected to outputs of AD converters 0 to 7. Each of AD converters 0 to 7 is a delta-sigma AD converter, for example, and each of filters 0 to 7 is a decimation filter.

AD converters 0 to 7 in integrated circuit 105 all have the same AD conversion characteristics. AD conversion characteristics are parameters such as resolution (the number of bits). Specifically, AD converters 0 to 7 are implemented by an identical AD converter product. This can reduce measurement errors occurring among the voltages V0 to V7 due to AD conversion.

Reference bias generation unit 116 supplies a common reference voltage to AD converters 0 to 7, AD converter 113, and AD converter 125. Reference bias generation unit 116 can reduce AD conversion errors due to variations in reference voltage.

Timing signal generation unit 117 supplies, to AD converters 0 to 7, AD converter 113, and AD converter 125, a timing signal for synchronizing measurement times of AD converters 0 to 7, AD converter 113, and AD converter 125. Timing signal generation unit 117 enables measuring the voltages V0 to V7, the current Iac, and a current Icd at a single time.

First calculation unit 118 calculates the AC impedances of batteries B0 to B7 based on the current Iac measured by current measurement unit 112 and the voltages V0 to V7 measured by voltage measurement unit 115. First calculation unit 118 is, in other words, an AC impedance calculation unit. A detailed configuration of first calculation unit 118 will be described below.

Second calculation unit 119 calculates at least one of the state of charge (SOC) and the SOH of each of batteries B0 to B7 using the AC impedance calculated by first calculation unit 118. Second calculation unit 119 is, in other words, an SOC/SOH calculation unit.

First temperature measurement unit 120 measures the temperatures Tcell0 to Tcell7 of batteries B0 to B7 using temperature sensors S0 to S7 provided in one-to-one correspondence for batteries B0 to B7. Temperature sensors S0 to S7 are thermistor-based temperature sensors, for example, but may be temperature sensors based on other elements such as a thermocouple.

Second temperature measurement unit 121 measures the temperature Tref1 of first reference resistor 103 using temperature sensor 107 provided near first reference resistor 103. Temperature sensor 107 is a thermistor-based temperature sensor, for example, but may be a temperature sensor based on other elements such as a thermocouple.

First temperature control unit 122 controls the temperature of first reference resistor 103 to be constant. Specifically, first temperature control unit 122 obtains the temperature Tref1 of first reference resistor 103 measured by second temperature measurement unit 121 and controls heater 108 so that the temperature Tref1 obtained is kept constant.

Load current measurement unit 123 measures the current Icd flowing through load 102. Specifically, load current measurement unit 123 measures the voltage at both ends of second reference resistor 124. Based on the resistance of second reference resistor 124, first calculation unit 118 can recognize the voltage at both ends of second reference resistor 124 as the current Icd.

Specifically, load current measurement unit 123 includes: an AD converter 125 that converts the voltage (that is, an analog signal) at both ends of second reference resistor 124 into a digital signal; and filter 126 connected to an output of AD converter 125. AD converter 125 is a delta-sigma AD converter, for example, and filter 126 is a decimation filter. AD converter 125 is implemented by for example, an AD converter having the same AD conversion characteristics as AD converters 0 to 7 (that is, an identical product). This can reduce errors occurring between AD converters 0 to 7 and AD converter 125 due to AD conversion.

Third temperature measurement unit 127 measures the temperature Tref2 of second reference resistor 124 using temperature sensor 128 provided near second reference resistor 124. Temperature sensor 128 is a thermistor-based temperature sensor, for example, but may be a temperature sensor based on other elements such as a thermocouple.

Second temperature control unit 129 controls the temperature of second reference resistor 124 to be constant. Specifically, second temperature control unit 129 obtains the temperature Tref2 of second reference resistor 124 measured by third temperature measurement unit 127 and controls heater 130 so that the temperature Tref2 obtained is kept constant.

Communication interface unit 131 is a communication circuit for battery monitoring device 100 to communicate with other battery monitoring devices or external devices. For example, communication interface unit 131 is used for transmitting the SOH calculated by second calculation unit or the like to an external device. Communication interface unit 131 may perform wireless or wired communication. Any communication standard may be adopted for communication performed by communication interface unit 131.

[Operations]

Figure 4:
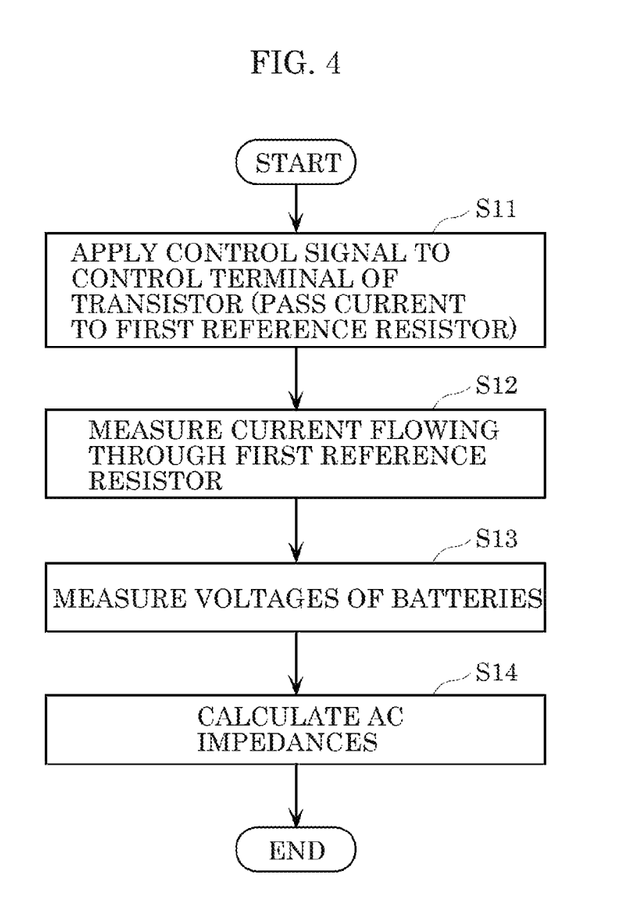
FIG. 4 is a flowchart of operations of the battery monitoring device according to the embodiment.

Now, operations of battery monitoring device 100 will be described. FIG. 4 is a flowchart of operations of battery monitoring device 100.

First, signal application unit 109 applies a control signal to the control terminal of transistor 104 (S11). As a result, transistor 104 is turned on to pass current to first reference resistor 103.

Figure 5:
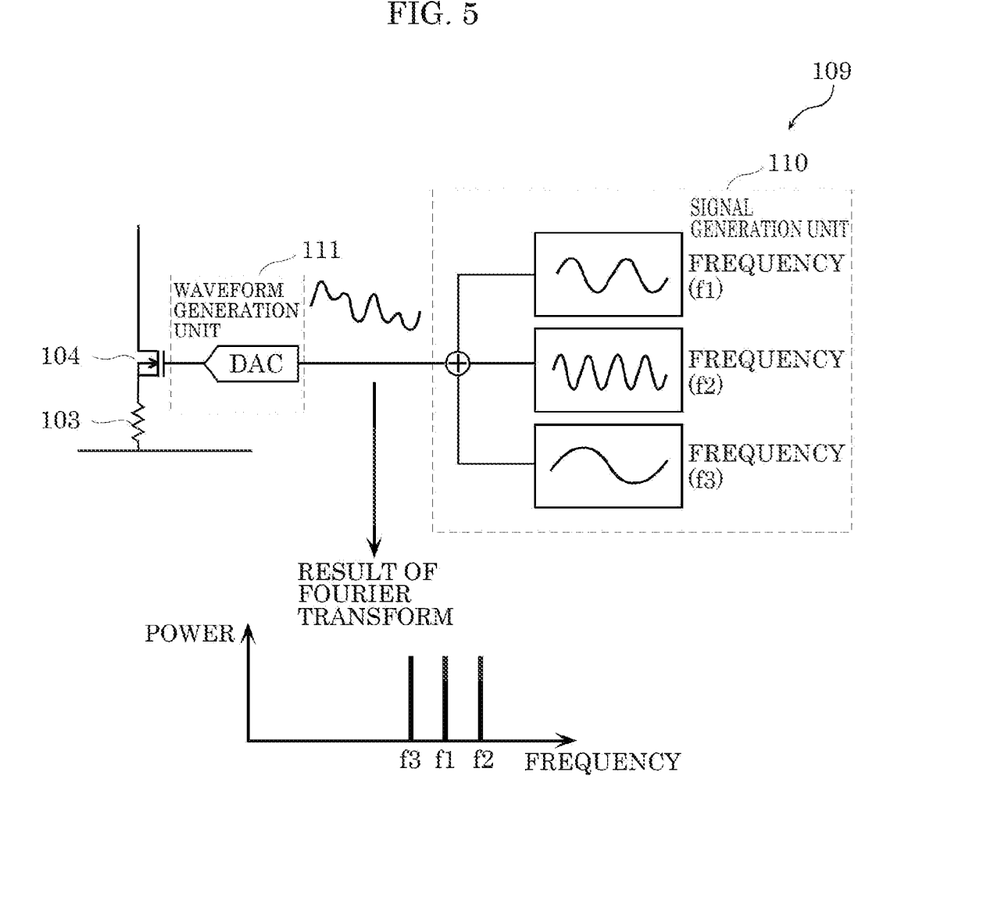
FIG. 5 is a diagram for describing a method of generating a control signal.

In the above operation, signal application unit 109 generates a control signal having multiple frequency components. FIG. 5 is a diagram for describing a method of generating the control signal.

For example, signal generation unit 110 in signal application unit 109 generates a sine wave of a frequency f1, a sine wave of a frequency f2, and a sine wave of a frequency f3, combines these sine waves, and outputs the resultant combined signal. Fourier-transforming the combined signal reveals three frequency components: the frequency f1, the frequency f2, and the frequency f3.

The signal output from signal generation unit 110 is a digital signal, which is converted by waveform generation unit 111 into an analog signal. That is, waveform generation unit 111 is a digital-to-analog (DA) converter, for example.

According to the control signal as above, current including multiple frequency components flows through first reference resistor 103. First calculation unit 118 can therefore calculate an AC impedance for each of the frequencies.

Current measurement unit 112 then measures the current Iac flowing through first reference resistor 103 (S12). Specifically, current measurement unit 112 measures the voltage at both ends of first reference resistor 103. The voltage at both ends of first reference resistor 103 is converted by AD converter 113 into a digital signal, which is output to first calculation unit 118 via filter 114.

Voltage measurement unit 115 then measures the voltages V0 to V7 of batteries B0 to B7 (S13). The voltages V0 to V7 are converted by AD converters 0 to 7 into digital signals, which are output to first calculation unit 118 via filters 0 to 7.

Figure 6:
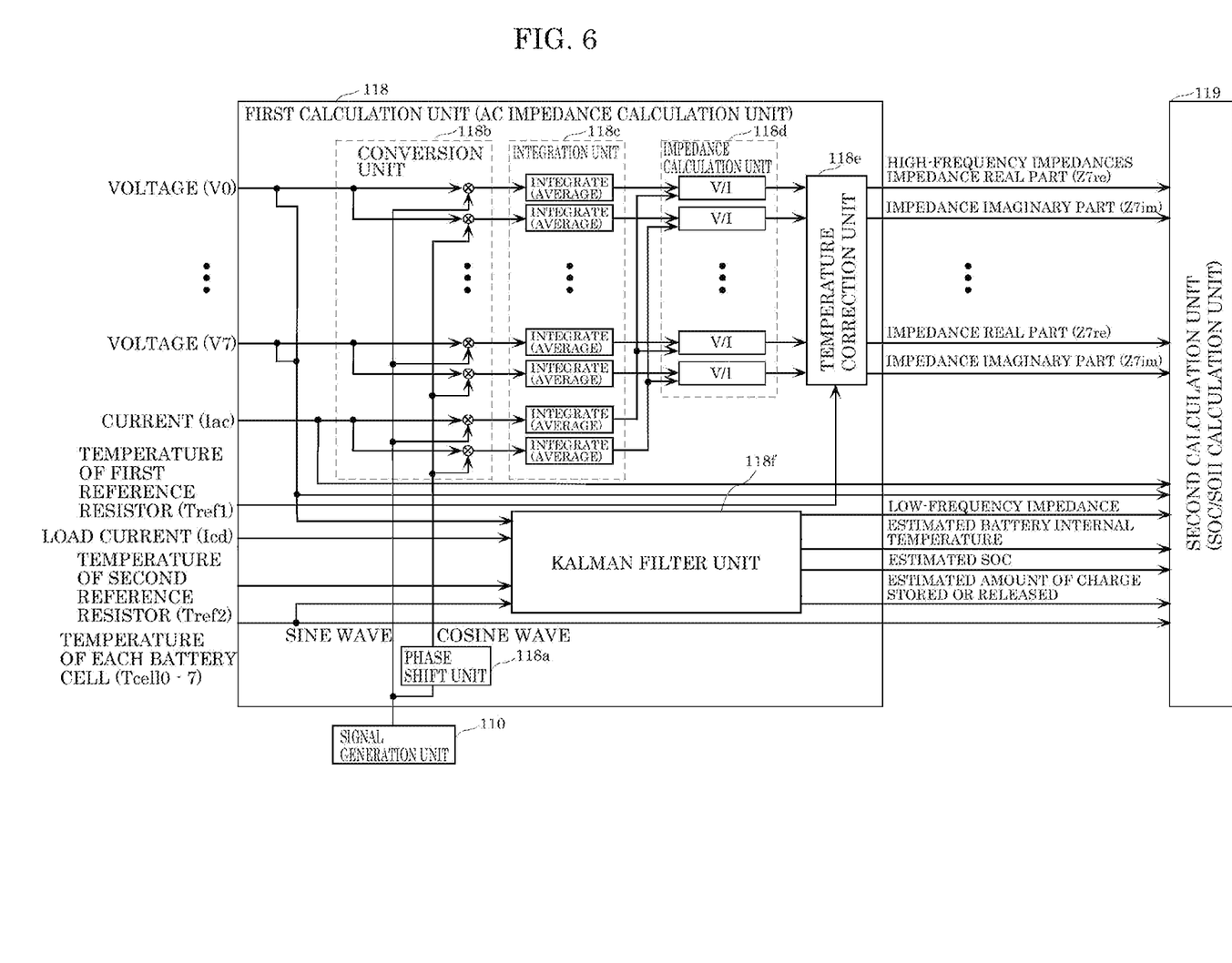
FIG. 6 is a diagram illustrating a detailed configuration of a first calculation unit.

First calculation unit 118 then calculates the AC impedances of batteries B0 to B7 based on the current Iac measured and the voltages V0 to V7 measured (S14). FIG. 6 is a diagram illustrating a detailed configuration of first calculation unit 118.

As illustrated in FIG. 6, specifically, first calculation unit 118 includes phase shift unit 118a, conversion unit 118b, integration unit 118c, impedance calculation unit 118d, temperature correction unit 118e, and Kalman filter unit 118f. FIG. 6 also illustrates signal generation unit 110 and second calculation unit 119.

Signal generation unit 110 generates a sine wave (an example of a first signal). Phase shift unit 118a shifts the sine wave 90 degrees to generate a cosine wave (an example of a second signal). Phase shift unit 118a is implemented by a delay circuit, for example. In battery monitoring device 100, signal generation unit 110 (that is, signal generation unit 110 for generating the control signal) in signal application unit 109 also serves as a signal generation unit for generating the sine wave for obtaining a complex current and complex voltages. Alternatively, the sine wave for obtaining the complex voltages may be generated by a signal generation unit different from signal generation unit 110.

Conversion unit 118b converts the current Iac into a complex current (an example of a second current) by multiplying the current Iac by each of the sine wave generated by signal generation unit 110 and the cosine wave generated by phase shift unit 118a. Conversion unit 118b also converts the voltages V0 to V7 into complex voltages (examples of a second voltage) by multiplying the voltages V0 to V7 by each of the sine wave generated by signal generation unit 110 and the cosine wave generated by phase shift unit 118a. Conversion unit 118b is implemented by a multiplication circuit, for example.

Integration unit 118c performs averaging processing on the complex current and averaging processing on the complex voltages. Integration unit 118c is implemented by an integration circuit, for example.

Impedance calculation unit 118d calculates AC impedances (shown as high-frequency impedances in FIG. 6) based on the complex current subjected to the averaging processing and the complex voltages subjected to the averaging processing. Impedance calculation unit 118d calculates each AC impedance by dividing the complex voltage subjected to the averaging processing by the complex current subjected to the averaging processing. For example, as the AC impedance of battery B0, an impedance real part Z0re and an impedance imaginary part Z0im are output. Impedance calculation unit 118d is implemented by a dividing circuit, for example.

Temperature correction unit 118e corrects the AC impedances based on the temperature Tref1 of first reference resistor 103 measured by second temperature measurement unit 121. For example, temperature correction unit 118e corrects the AC impedances in the environment at the temperature Tref1 to acquire AC impedances that would be obtained in an environment at a reference temperature.

As described above, first reference resistor 103 is disposed in path P2 different from path P1 of the current flowing from battery B to load 102. Battery monitoring device 100 can therefore calculate the AC impedance of battery B irrespective of whether or not battery B is being charged or discharged. The AC impedance of battery B is continuously measured, for example, but may be measured periodically (that is, intermittently) or in response to an instruction from an external device (for example, an integrated control unit to be described below).

[Calculating SOH and SOC]

Second calculation unit 119 calculates the SOHs of batteries B0 to B7 by estimating a circuit parameter of the equivalent circuits of batteries B0 to B7 based on the AC impedances calculated by first calculation unit 118. Calculating the SOHs based on the circuit parameter estimation may adopt known methods.

Calculating the SOHs (that is, estimating the circuit parameter) may use a low-frequency impedance in addition to the AC impedances (in other words, high-frequency impedances). The low-frequency impedance is an AC impedance for a frequency lower than the frequency for the AC impedances calculated by first calculation unit 118. By taking the low-frequency impedance into account in estimating the circuit parameter, the accuracy of SOH calculation can be increased.

The low-frequency impedance is calculated by Kalman filter unit 118f. Kalman filter unit 118f calculates the low-frequency AC impedance using at least one of a charging current during the charging of batteries B0 to B7 and a discharging current during the discharging of batteries B0 to B7.

Calculating the SOHs (that is, estimating the circuit parameter) may also use the temperatures Tcell0 to Tcell7 of batteries B0 to B7 measured by first temperature measurement unit 120. By taking the temperatures Tcell0 to Tcell7 of batteries B0 to B7 into account in estimating the circuit parameter, the accuracy of SOH calculation can be increased.

Second calculation unit 119 may also calculate the SOCs of batteries B0 to B7 by estimating the circuit parameter of the equivalent circuits of batteries B0 to B7 based on the AC impedances calculated by first calculation unit 118. Calculating the SOCs based on circuit parameter estimation may adopt known methods.

[Variations of Control Signal Generation]

Figure 7:
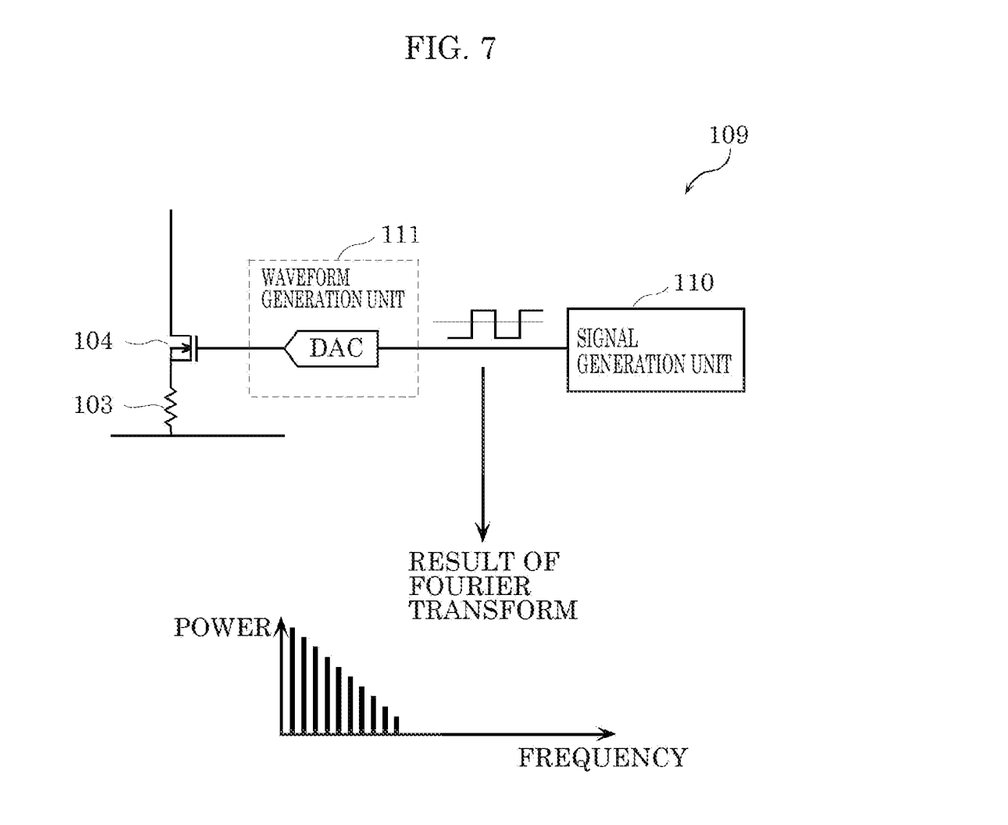
FIG. 7 is a first diagram for describing a method of generating a control signal according to a variation.

The method of generating the control signal having multiple frequency components by signal application unit 109 is not limited to the one illustrated in FIG. 5. FIG. 7 is a first diagram for describing a method of generating the control signal according to a variation.

In the example of FIG. 7, signal generation unit 110 outputs a rectangular wave as the control signal. Signal generation unit 110 in this case has a configuration similar to that of a pulse generator, and can change the frequency and the voltage value of the control signal. Fourier-transforming the rectangular wave reveals multiple frequency components.

The signal output from signal generation unit 110 is a digital signal, which is converted by waveform generation unit 111 into an analog signal. In the example of FIG. 7, waveform generation unit 111 may be eliminated.

Figure 8:
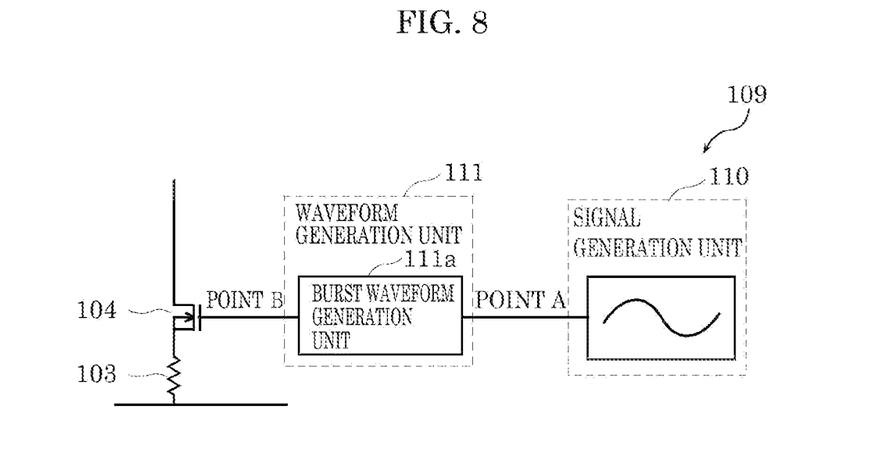
FIG. 8 is a second diagram for describing a method of generating a control signal according to a variation.

FIG. 8 is a second diagram for describing a method of generating the control signal according to a variation. In the example of FIG. 8, signal generation unit 110 outputs a sine wave as the control signal.

Figure 9:
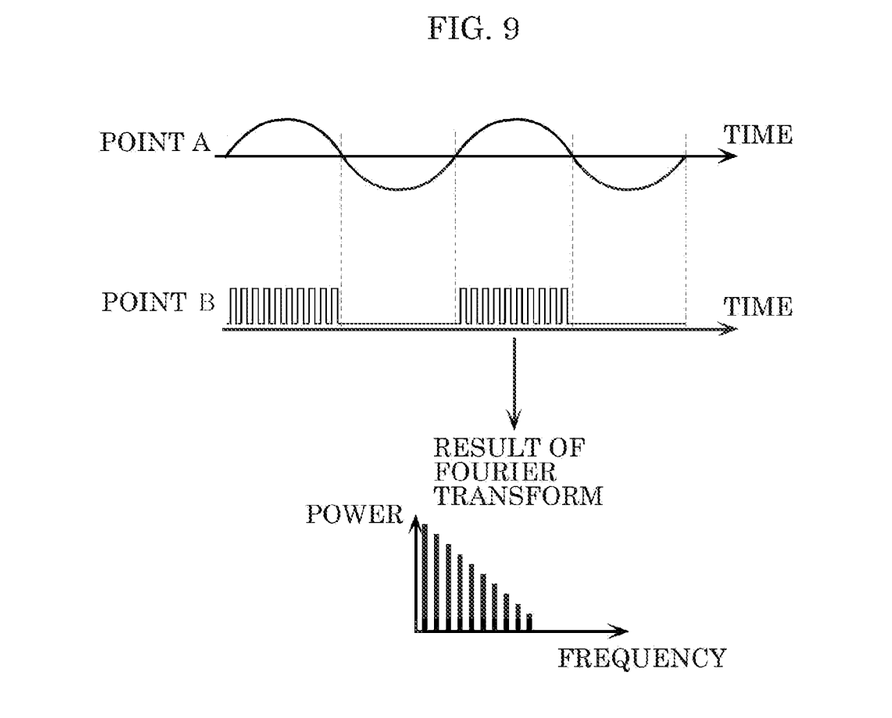
FIG. 9 is a diagram for describing a method of generating a burst waveform.

Waveform generation unit 111 includes burst waveform generation unit 111a. Based on the sine wave output from signal generation unit 110, burst waveform generation unit 111a generates a control signal having a burst waveform. FIG. 9 is a diagram for describing a method of generating the burst waveform.

The burst waveform is a waveform that includes a rectangular wave only in part of the time domain. As illustrated in FIG. 9, for example, the sine wave takes positive values in first intervals and takes negative values in second intervals, and burst waveform generation unit 11a selectively outputs the rectangular wave only in first intervals. That is, the burst waveform alternately has a first interval in which a rectangular wave is output and a second interval in which no rectangular wave is output. The control signal in this case has multiple frequency components in the first intervals.

According to the control signal having the burst waveform as above, a rectangular wave is intermittently output. This reduces power consumption.

[Variations of the Number of Batteries]

Figure 10:
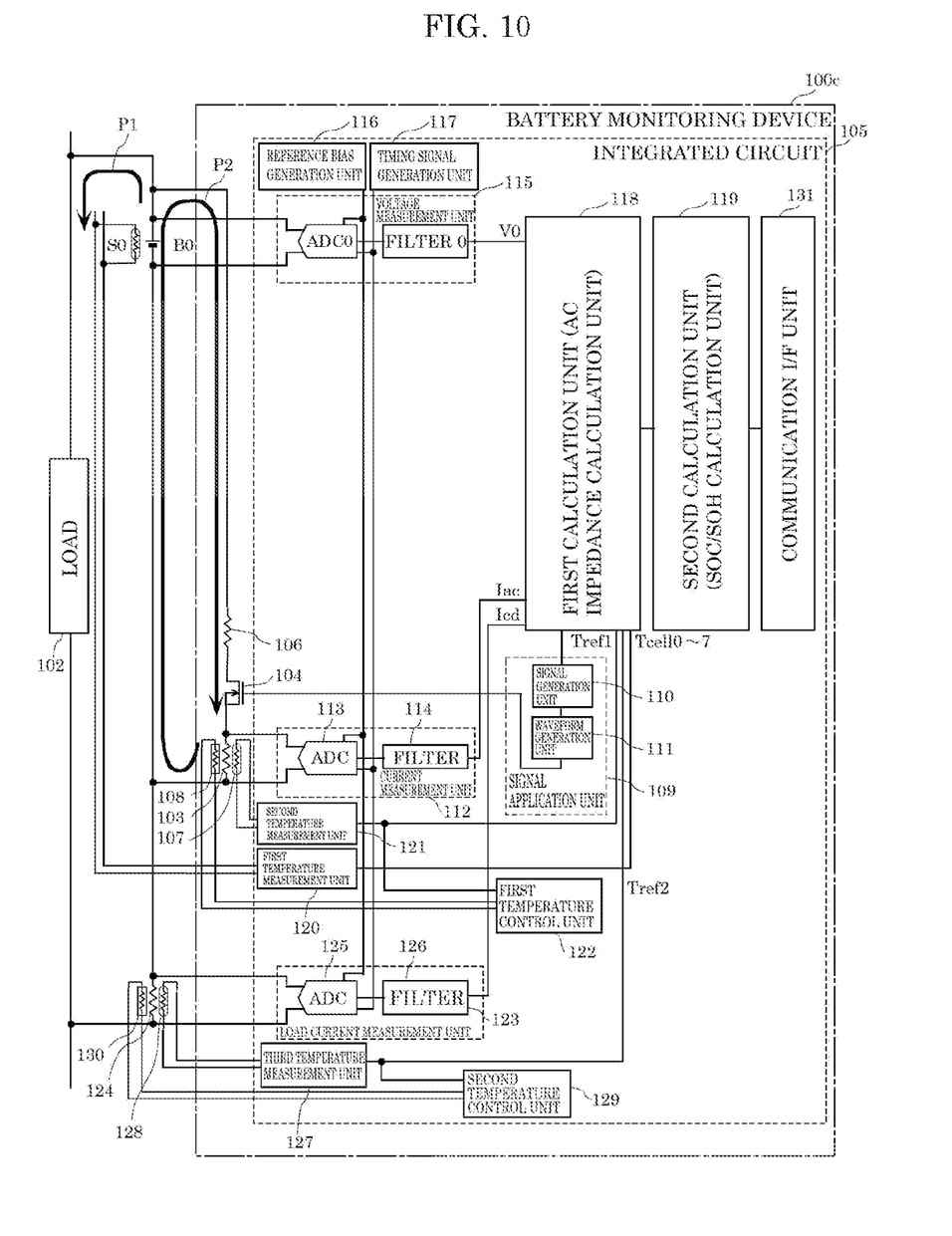
FIG. 10 is a block diagram illustrating a functional configuration of a battery monitoring device that monitors single battery.

Although battery pack 101 includes eight batteries B0 to B7, battery pack 101 may include more or less than eight batteries. Battery monitoring device 100 may also monitor single battery B. FIG. 10 is a block diagram illustrating a functional configuration of battery monitoring device 100c that monitors single battery B0.

Thus, any number of integrated circuits 105 and any number of battery monitoring devices 100c may be used to scalably implement a mechanism that measures any number of battery cells.

Advantageous Effects

As described above, battery monitoring device 100 includes: first reference resistor 103 disposed in path P2 different from path P1 of current flowing from battery B to load 102; transistor 104 for passing current from battery B to first reference resistor 103; and integrated circuit 105. Integrated circuit 105 includes: signal application unit 109 that applies a control signal to a control terminal of transistor 104; current measurement unit 112 that measures a first current flowing through first reference resistor 103; voltage measurement unit 115 that measures a first voltage of battery B; and first calculation unit 118 that calculates an AC impedance of battery B based on the first current measured and the first voltage measured.

Because first reference resistor 103 is disposed in path P2 different from path P1 of the current flowing from battery B to load 102, battery monitoring device 100 as above can measure the AC impedance of battery B irrespective of whether battery B is being charged or discharged.

Signal application unit 109 applies the control signal having multiple frequency components to the control terminal.

Signal application unit 109 as above enables first calculation unit 118 to calculate the AC impedance for each of multiple frequencies.

For example, signal application unit 109 is capable of changing a frequency and a voltage value of the control signal.

Signal application unit 109 as above enables arbitrarily adjusting the current flowing through first reference resistor 103.

For example, the control signal has a burst waveform.

The control signal having the burst waveform as above causes a rectangular wave to be intermittently output, leading to reduced power consumption.

For example, integrated circuit 105 includes: signal generation unit 110 that generates a first signal that is a sine wave; and phase shift unit 118a that shifts a phase of the first signal 90 degrees to generate a second signal. First calculation unit 118 converts the first current into a second current that is a complex current by multiplying each of the first signal and the second signal generated and the first current measured, converts the first voltage into a second voltage that is a complex voltage by multiplying each of the first signal and the second signal generated and the first voltage measured, and calculates the AC impedance based on the second current and the second voltage.

Battery monitoring device 100 as above can calculate the AC impedance based on the complex voltage and the complex current.

For example, first calculation unit 118 performs averaging processing on the second current and averaging processing on the second voltage, and calculates the AC impedance based on the second current subjected to the averaging processing and the second voltage subjected to the averaging processing.

Through averaging, battery monitoring device 100 as above can increase the accuracy of calculating the AC impedance.

For example, integrated circuit 105 further includes second calculation unit 119 that calculates at least one of an SOC and an SOH of battery B using the AC impedance calculated.

Battery monitoring device 100 as above can calculate at least one of the SOC and the SOH.

For example, first calculation unit 118 calculates the AC impedance for each of multiple frequencies, and second calculation unit 119 calculates the SOH using the AC impedance for each of the multiple frequencies.

Battery monitoring device 100 as above can calculate the SOH using the AC impedance for each of the multiple frequencies.

For example, integrated circuit 105 further includes first temperature measurement unit 120 that measures a temperature of battery B. Second calculation unit 119 calculates the SOH using the AC impedance calculated and the temperature of battery B measured.

Battery monitoring device 100 as above can increase the accuracy of calculating the SOH by taking the temperature of battery B into account in estimating a circuit parameter of an equivalent circuit of battery B.

For example, first calculation unit 118 further includes Kalman filter unit 118f that calculates a low-frequency AC impedance using at least one of a charging current during charging of battery B and a discharging current during discharging of battery B. Second calculation unit 119 calculates the SOH using the AC impedance calculated and the low-frequency AC impedance calculated.

Battery monitoring device 100 as above can increase the accuracy of calculating the SOH by taking the low-frequency AC impedance of battery B into account in estimating the circuit parameter of the equivalent circuit of battery B.

For example, integrated circuit 105 further includes second temperature measurement unit 121 that measures a temperature of first reference resistor 103. First calculation unit 118 calculates the AC impedance by further using the temperature of first reference resistor 103 measured.

Battery monitoring device 100 as above can correct the AC impedance using the temperature of first reference resistor 103.

For example, integrated circuit 105 has first temperature control unit 122 that controls the temperature of first reference resistor 103 to be constant.

Battery monitoring device 100 as above can calculate the AC impedance while the temperature of first reference resistor 103 is kept constant.

For example, first calculation unit 118 calculates the AC impedance during charging of battery B.

Battery monitoring device 100 as above can calculate the AC impedance during charging of battery B.

For example, first calculation unit 118 calculates the AC impedance during discharging of battery B.

Battery monitoring device 100 as above can calculate the AC impedance during discharging of battery B.

For example, first calculation unit 118 calculates the AC impedance during a stoppage of charging and discharging of battery B.

Battery monitoring device 100 as above can calculate the AC impedance during a stoppage of charging and discharging of battery B.

For example, battery B is one of batteries B0 to B7 in battery pack 101.

Battery monitoring device 100 as above can calculate the AC impedance of battery B in battery pack 101.

Integrated circuit 105 includes: transistor 104 for passing a current from battery B to first reference resistor 103 disposed in path P2 different from path P1 of current flowing from battery B to load 102. Integrated circuit 105 includes: signal application unit 109 that applies a control signal to a control terminal of transistor 104; current measurement unit 112 that measures a first current flowing through first reference resistor 103; voltage measurement unit 115 that measures a first voltage of battery B; and first calculation unit 118 that calculates an AC impedance of battery B based on the first current measured and the first voltage measured.

Because first reference resistor 103 is disposed in path P2 different from path P1 of current flowing from battery B to load 102, integrated circuit 105 as above can measure the AC impedance of battery B irrespective of whether or not battery B is being charged or discharged.

For example, battery B is one of batteries B0 to B7 in battery pack 101, and voltage measurement unit 115 includes AD converters 0 to 7 for measuring voltages of respective batteries B0 to B7. Integrated circuit 105 further includes reference bias generation unit 116 that supplies a common reference voltage to AD converters 0 to 7.

Integrated circuit 105 as above can reduce AD conversion errors due to variations in reference voltage.

For example, battery B is one of batteries B0 to B7 in battery pack 101, and voltage measurement unit 115 includes AD converters 0 to 7 for measuring voltages V0 to V7 of respective batteries B0 to B7. Integrated circuit 105 further includes timing signal generation unit 117 that supplies, to each of AD converters 0 to 7, a timing signal for synchronizing measurement times of AD converters 0 to 7.

Integrated circuit 105 as above can measure the voltages V0 to V7 at a single time.

For example, AD converters 0 to 7 have identical AD conversion characteristics.

Integrated circuit 105 as above can reduce AD conversion variations of AD converters 0 to 7.

Embodiment 2

[Configuration and Operations]

Figure 11:
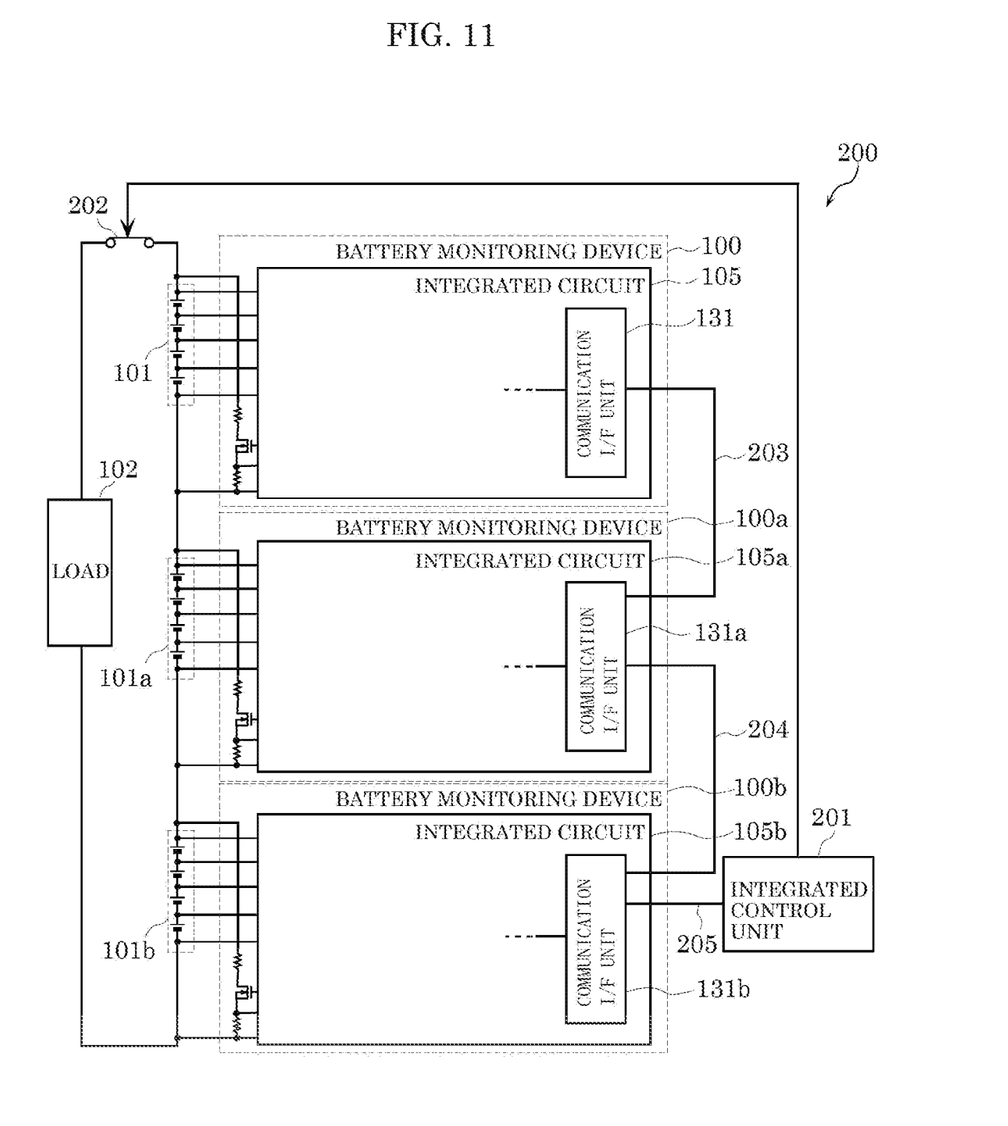
FIG. 11 is a block diagram illustrating a functional configuration of a battery monitoring system according to Embodiment 2.

In Embodiment 2, a battery monitoring system that includes at least multiple battery monitoring devices 100 will be described. FIG. 11 is a block diagram illustrating a functional configuration of the battery monitoring system according to Embodiment 2.

As illustrated in FIG. 11, battery monitoring system 200 includes multiple battery monitoring devices (specifically, battery monitoring devices 100, 100a, and 100b), integrated control unit 201, and switch 202. Battery monitoring device 100 monitors battery pack 101, battery monitoring device 100a monitors battery pack 101a, and battery monitoring device 100b monitors battery pack 101b. Battery packs 101, 101a, and 101b are serially connected.

Integrated circuit 105 in battery monitoring device 100 includes communication interface unit 131. Battery monitoring device 100a is configured as with battery monitoring device 100, and integrated circuit 105a in battery monitoring device 100a includes communication interface unit 131a. Battery monitoring device 100b is configured as with battery monitoring device 100, and integrated circuit 105b in battery monitoring device 100b includes communication interface unit 131b.

Communication interface units 131, 131a, and 131b are daisy-chained. Communication interface unit 131 is connected to communication interface unit 131a via communication line 203, and communication interface unit 131a is connected to communication interface unit 131b via communication line 204. Communication interface unit 131b is connected to integrated control unit 201 via communication line 205.

Through communication lines 203, 204, and 205 as above, integrated control unit 201 can obtain the AC impedances of battery pack 101 from battery monitoring device 100, obtain the AC impedances of battery pack 101a from battery monitoring device 100a, and obtain the AC impedances of battery pack 101b from battery monitoring device 100b. It is to be noted that integrated control unit 201 may obtain, from each of battery monitoring devices 100, 100a, and 100b, AC impedance-based information different from the AC impedances (for example, SOHs).

Integrated control unit 201 performs various sorts of control based on the AC impedances obtained from battery monitoring devices 100, 100a, and 100b. For example, if integrated control unit 201 determines that at least one of battery packs 101, 101a, and 101b has deteriorated to below a predetermined criterion based on the AC impedances, integrated control unit 201 opens switch 202 to electrically disconnect load 102 from battery packs 101, 101a, and 101b. This can prevent an accident such as a battery pack fire due to the use of a deteriorated battery pack. Integrated control unit 201 is implemented by, for example, a microcomputer that includes a processor and memory.

Although communication interface units 131, 131a, and 131b are daisy-chained in battery monitoring system 200, this is merely an exemplary manner of connection. In battery monitoring system 200, communication interface units 131, 131a, and 131b may each be directly connected with integrated control unit 201. That is, the communication interfaces may be connected in any manner.

Advantageous Effects

As described above, battery monitoring system 200 includes: multiple battery monitoring devices; and integrated control unit 201 that obtains AC impedances from each of the multiple battery monitoring devices.

Integrated control unit 201 can thus perform various sorts of control based on the AC impedances obtained from each of the battery monitoring devices.

Embodiment 3

[Configuration and Operations]

Figure 12:
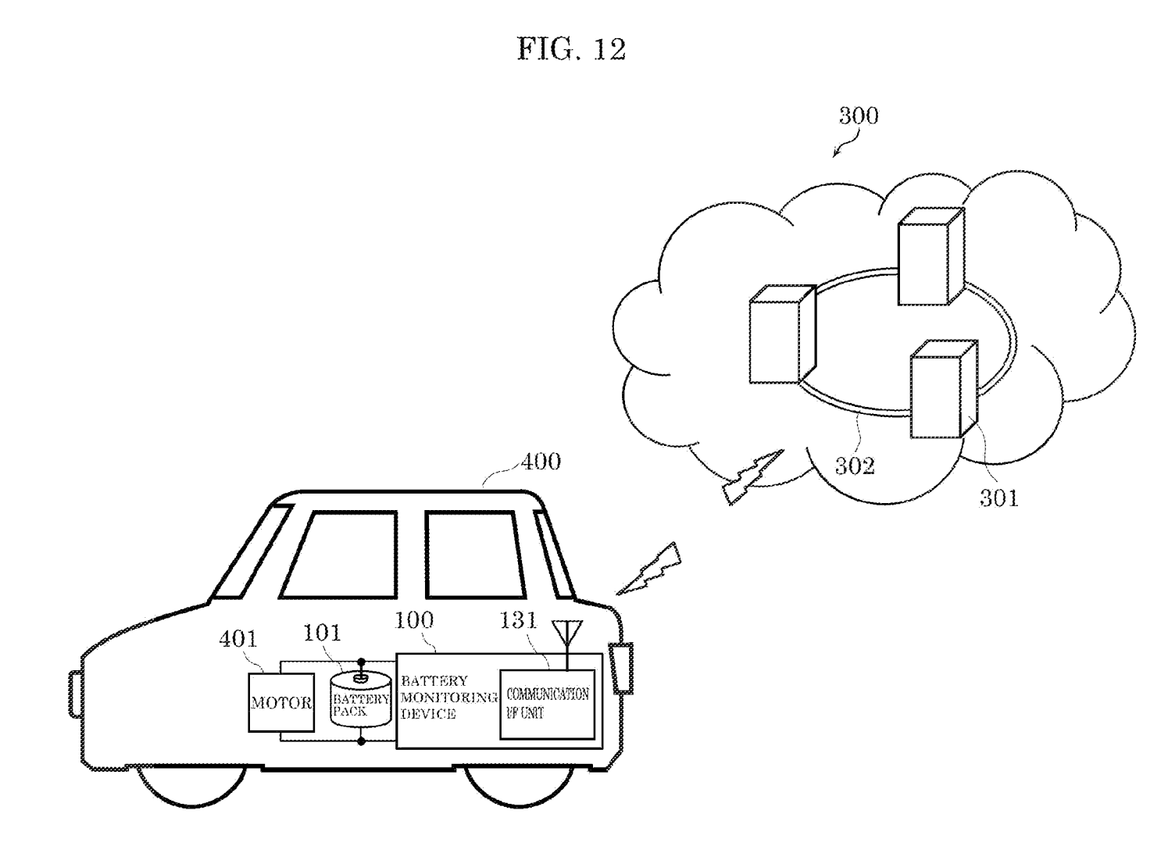
FIG. 12 illustrates an outline of a battery monitoring system according to Embodiment 3.

In Embodiment 3, a battery monitoring system that includes a cloud server will be described. FIG. 12 illustrates an outline of the battery monitoring system according to Embodiment 3.

As illustrated in FIG. 12, battery monitoring system 300 includes battery monitoring device 100 and server device 301. Server device 301 is located remote from battery monitoring device 100. Server device 301 is what is called a cloud server. For example, server device 301 is communicatively connected with other server devices over cloud network 302.

For example, battery monitoring device 100 is provided in automobile 400 such as an EV and monitors battery pack 101 used to drive motor 401 of automobile 400. Communication interface unit 131 in battery monitoring device 100, for example, transmits the AC impedances of battery pack 101 calculated to server device 301 through wireless communication. A relay device not shown may intervene between communication interface unit 131 and server device 301.

Server device 301 obtains the AC impedances from battery monitoring device 100 and stores them in storage (not shown) in server device 301. Server device 301 performs various sorts of control based on the AC impedances obtained from battery monitoring device 100.

For example, if server device 301 determines that battery pack 101 has deteriorated to below a predetermined criterion based on the AC impedances, server device 301 transmits information for stopping the use of battery pack 101 to battery monitoring device 100. This can prevent an accident such as battery pack 101 catching fire due to the use of deteriorated battery pack 101.

Advantageous Effects

As described above, battery monitoring system 300 includes battery monitoring device 100 and server device 301 located remote from battery monitoring device 100. Server device 301 obtains AC impedances from battery monitoring device 100.

Server device 301 can thus perform various sorts of control based on the AC impedances obtained from battery monitoring device 100.

OTHER EMBODIMENTS

Although an embodiment has been described up to this point, the present disclosure is not limited to the above-described embodiment.

For example, although a battery monitoring device that monitors a battery used in vehicles such as EVs is described in the foregoing embodiment, the battery monitoring device is may monitor a battery for any purpose.

Furthermore, the circuit configurations described in the foregoing embodiment are mere examples, and the present disclosure is not limited to the above-described circuit configurations. Specifically, the present disclosure also encompasses a circuit capable of realizing the characteristic functions of the present disclosure in the same manner as the above-described circuit configurations. For example, the present disclosure also encompasses a circuit configuration in which an element such as a switching element (transistor), a resistive element, or a capacitive element is connected in series or in parallel to a certain element, within a scope that realizes the same functions as the above-described circuit configurations.

Furthermore, in the foregoing embodiment, the structural components included in the integrated circuit are implemented using hardware. However, part of the structural components included in the integrated circuit may be implemented by executing a software program suitable for the structural component. Part of the structural components included in the integrated circuit may be implemented by means of a program executer, such as a CPU or a processor, reading and executing the software program recorded on a recording medium such as a hard disk or a semiconductor memory.

Furthermore, in the foregoing embodiment, processes executed by a specific processing unit may be executed by another processing unit. Moreover, in the operations described in the foregoing embodiment, the order of processes may be changed or processes may be executed in parallel.

Aside from the above, the present disclosure also encompasses forms obtained by various modification to respective embodiments that can be conceived by a person of skill in the art, or forms realized by any combination of structural components and functions in the respective embodiments without departing from the spirit of the present disclosure.

What is claimed is:

1. A battery monitoring device, comprising:
    a resistor disposed in a path different from a path of current flowing from a battery to a load;
    a transistor for passing current from the battery to the resistor; and
    an integrated circuit, wherein:
    the integrated circuit includes:
        a current measurement unit that measures a first current flowing through the resistor;
        a voltage measurement unit that measures a first voltage of the battery;
        a first calculation unit that calculates an AC impedance of the battery based on the first current measured and the first voltage measured; and
        a signal application unit that applies a control signal to a control terminal of the transistor, and
    the signal application unit applies the control signal having a plurality of frequency components to the control terminal.

2. The battery monitoring device according to claim 1, wherein
    the signal application unit is capable of changing a frequency and a voltage value of the control signal.

3. The battery monitoring device according to claim 1, wherein
    the control signal has a burst waveform.

4. The battery monitoring device according to claim 1, wherein
    the integrated circuit further includes a second calculation unit that calculates at least one of a state of charge (SOC) or a state of health (SOH) of the battery using the AC impedance calculated.

5. The battery monitoring device according to claim 1, wherein
    the first calculation unit further includes a Kalman filter unit that calculates a low frequency impedance using at least one of a charging current during charging of the battery or a discharging current during discharging of the battery.

6. The battery monitoring device according to claim 1, wherein
    the integrated circuit further includes a second temperature measurement unit that measures a temperature of the resistor, and
    the first calculation unit calculates the AC impedance by further using the temperature of the resistor that was measured.

7. The battery monitoring device according to claim 1, wherein the integrated circuit further includes a temperature control unit that controls a temperature of the resistor to be constant.

8. The battery monitoring device according to claim 1, wherein
the first calculation unit calculates the AC impedance during charging of the battery.

9. The battery monitoring device according to claim 1, wherein
the first calculation unit calculates the AC impedance during discharging of the battery.

10. The battery monitoring device according to claim 1, wherein
the first calculation unit calculates the AC impedance during a stoppage of charging and discharging of the battery.

11. The battery monitoring device according to claim 1, wherein
the battery is one of a plurality of batteries included in a battery pack.

12. A battery monitoring system, comprising:
a plurality of battery monitoring devices each of which is the battery monitoring device according to claim 1; and
an integrated control unit that obtains the AC impedance from each of the plurality of battery monitoring devices.

13. A battery monitoring system, comprising:
the battery monitoring device according to claim 1; and
a server device disposed at a location away from the battery monitoring device, wherein the server device obtains the AC impedance from the battery monitoring device.

14. A battery monitoring device, comprising:
a resistor disposed in a path different from a path of current flowing from a battery to a load;
a transistor for passing current from the battery to the resistor; and
an integrated circuit,
wherein the integrated circuit includes:
a current measurement unit that measures a first current flowing through the resistor;
a voltage measurement unit that measures a first voltage of the battery;
a first calculation unit that calculates an AC impedance of the battery based on the first current measured and the first voltage measured;
a signal generation unit that generates a first signal which is a sine wave; and
a phase shift unit that shifts a phase of the first signal by 90 degrees to generate a second signal.

15. The battery monitoring device according to claim 14, wherein the first calculation unit:
converts the first current into a second current which is a complex current, by multiplying the first current measured by each of the first signal and the second signal generated; and
calculates the AC impedance based on the second current.

16. The battery monitoring device according to claim 14, wherein the first calculation unit:
converts the first voltage into a second voltage which is a complex voltage, by multiplying the first voltage measured by each of the first signal and the second signal generated; and
calculates the AC impedance based on the second voltage.

17. An integrated circuit, comprising:
a signal application unit that applies a control signal to a control terminal of a transistor for passing a current from a battery to a resistor disposed in a path different from a path of current flowing from the battery to a load;
a current measurement unit that measures a first current flowing through the resistor;
a voltage measurement unit that measures a first voltage of the battery; and
a first calculation unit that calculates an AC impedance of the battery based on the first current measured and the first voltage measured; and
the signal application unit applies the control signal having a plurality of frequency components to the control terminal.

18. The integrated circuit according to claim 17, wherein
the battery is one of a plurality of batteries included in a battery pack, and
the voltage measurement unit includes a plurality of analog-to-digital (AD) converters each for measuring the voltage of a different one of the plurality of batteries,
the integrated circuit further comprising:
a reference bias generation unit that supplies a common reference voltage to the plurality of AD converters.

19. The integrated circuit according to claim 17, wherein
the battery is one of a plurality of batteries included in a battery pack, and
the voltage measurement unit includes a plurality of analog-to-digital (AD) converters each for measuring the voltage of a different one of the plurality of batteries,
the integrated circuit further comprising:
a timing signal generation unit that supplies each of the plurality of AD converters with a timing signal for synchronizing measurement timings of the plurality of AD converters.

* * * * *